(12) United States Patent
Kao

(10) Patent No.: US 8,698,216 B2
(45) Date of Patent: Apr. 15, 2014

(54) MEMORY DEVICE AND FABRICATION METHOD THEREOF

(75) Inventor: Ching-Hung Kao, Hsinchu (TW)

(73) Assignee: United Microelectronics Corporation, Hsinchu (TW)

( * ) Notice: Subject to any disclaimer, the term of this patent is extended or adjusted under 35 U.S.C. 154(b) by 61 days.

(21) Appl. No.: 13/451,625

(22) Filed: Apr. 20, 2012

(65) Prior Publication Data

US 2013/0277728 A1    Oct. 24, 2013

(51) Int. Cl.
*H01L 27/088*    (2006.01)
*H01L 29/94*    (2006.01)

(52) U.S. Cl.
USPC .................. 257/288; 257/900; 257/E21.626; 257/E21.64

(58) Field of Classification Search
USPC ................ 257/288, 900, E21.626, E21.64
See application file for complete search history.

(56) References Cited

U.S. PATENT DOCUMENTS

| 7,678,662 B2 | 3/2010 | Arghavani et al. |
| 2009/0152618 A1 | 6/2009 | Matsuo et al. |
| 2011/0062507 A1* | 3/2011 | Wu et al. ....................... 257/316 |

* cited by examiner

*Primary Examiner* — Thanh V Pham
(74) *Attorney, Agent, or Firm* — WPAT, PC; Justin King

(57) ABSTRACT

The present disclosure provides a fabricating method of a semiconductor chip which includes the following steps. First, a substrate is provided. The substrate defines a memory unit region and a peripheral logic region. Then, a first spacer is formed around a stack structure of the memory unit region. The first space includes a first silicon oxide layer and the first silicon oxide layer directly contacts with the stack structure. After that, a silicon nitride layer is formed on both the first spacer and the peripheral logic region. Finally, the additional silicon nitride layer on the first spacer is removed but portions of the additional silicon nitride layer around gate structures in the peripheral logic region are remained.

3 Claims, 3 Drawing Sheets

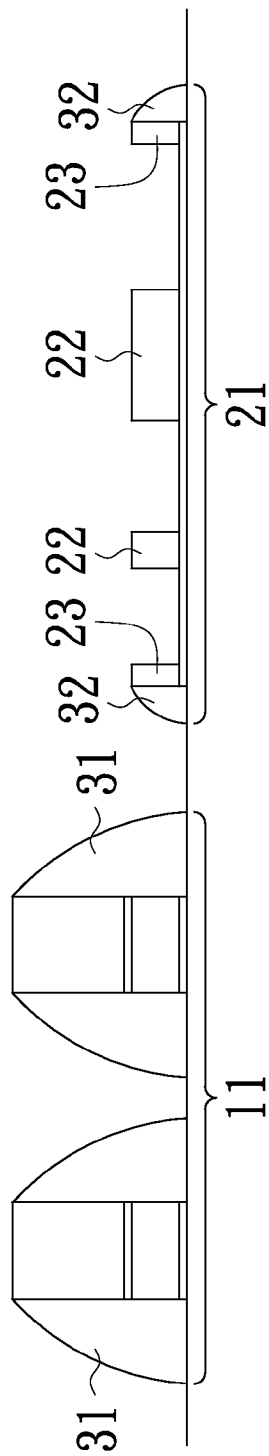
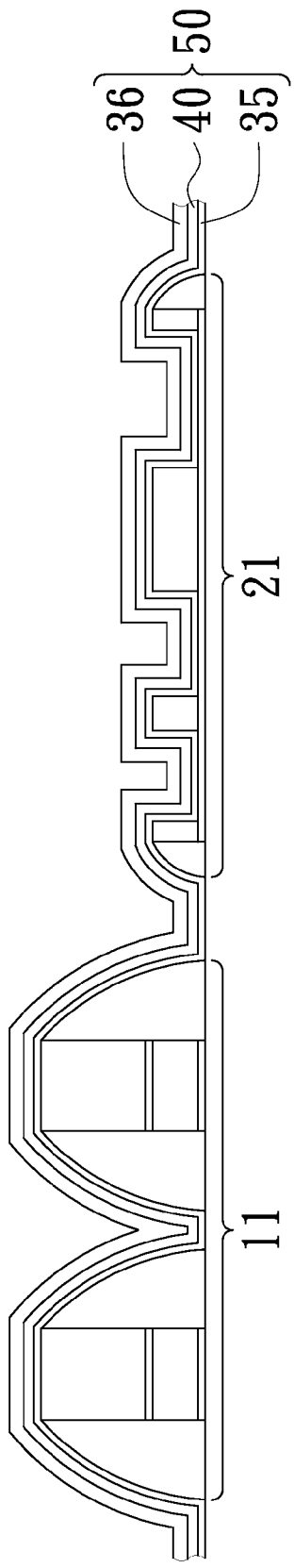

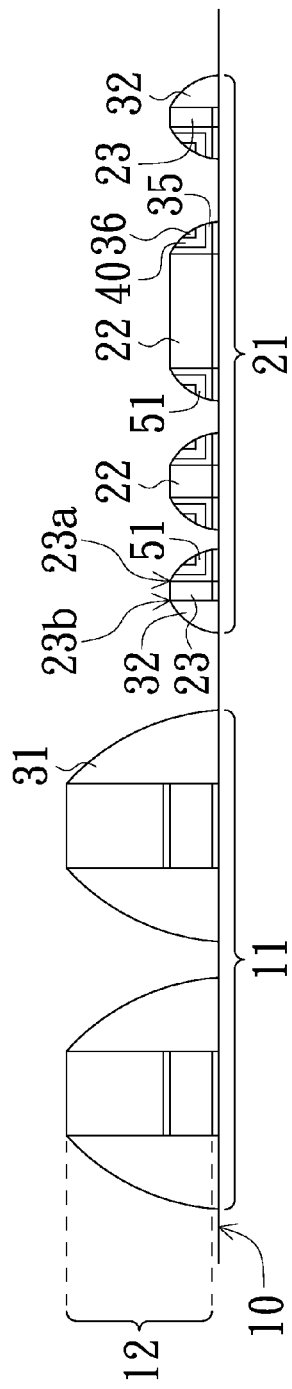
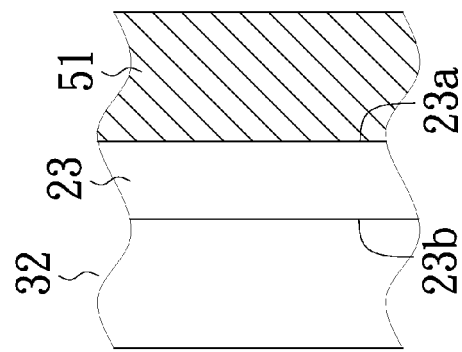

MEMORY DEVICE AND FABRICATION METHOD THEREOF

TECHNICAL FIELD

The present disclosure relates to a semiconductor chip and a fabricating method thereof, and more particularly to a semiconductor chip for a semiconductor memory device and a fabricating method thereof.

BACKGROUND

Typically, semiconductor memory device, such as embedded non-volatile memory, includes a plurality of metal oxide semiconductor (MOS) units in a peripheral logic region thereof. These MOS units are used to achieve a data reading/writing circuit. To improve the performance of the MOS units, spacers are usually formed around gate structures thereof. However, in a typical process, spacers are also formed simultaneously around floating gates and control gates of the non-volatile memory device.

The inventors of the present disclosure found that the spacers consisting of materials such as silicon nitride indeed improve the performance of the date reading/writing circuit. However, some heating processes are necessarily required in semiconductor fabricating process, and after these heating processes, the silicon nitride spacers around the floating gates and the control gates may lead to the shifting of the threshold of the erasing voltage of the non-volatile memory device. As a result, the data retention of the non-volatile memory device significantly deteriorates. Therefore, there is a desire to achieve the improvement of the performance of the data reading/writing circuit while avoiding the significantly deterioration of the data retention.

SUMMARY

The present disclosure provides a fabricating method of a semiconductor chip that is capable of improving the performance of the data reading/writing circuit while avoiding the significantly deterioration of the data retention of the non-volatile memory device. In one embodiment, a fabricating method of a semiconductor chip includes the following steps. First, a substrate is provided. The substrate defines a memory unit region and a peripheral logic region. Then, a first spacer is formed around a stack structure of the memory unit region. The first spacer includes a first silicon oxide layer and the first silicon oxide layer directly contacts with the stack structure. After that, a silicon nitride layer is formed on both the first spacer and the peripheral logic region. Finally, the silicon nitride layer on the first spacer is removed but portions of the additional silicon nitride layer around gate structures in the peripheral logic region are remained.

The present disclosure further provides a semiconductor chip for improving the performance of the data reading/writing circuit while avoiding the significantly deterioration of the data retention. In one embodiment, a semiconductor chip includes a substrate, a memory unit region and a peripheral logic region. The memory unit region is formed on the substrate, and the memory unit region includes a stack structure and a first spacer. The stack structure includes a floating gate, a control gate, and a dielectric layer. The floating gate is configured on the substrate, the control gate is configured on the floating gate, and the dielectric layer is interposed between the floating gate and the control gate. The first spacer is around the stack structure, and the first spacer includes a first silicon nitride layer that directly contacts with the stack structure. The peripheral logic region is configured on the substrate, and includes a gate structure and a second spacer. The gate structure is configured on the substrate, and the second spacer is around side surfaces of the gate structure. The second spacer includes an additional silicon nitride layer.

The present disclosure further provides a memory device chip for improving the performance of the data reading/writing circuit while avoiding the significantly deterioration of the data retention. In one embodiment, a memory device chip includes a substrate, a stack structure and a first spacer. The stack structure includes a floating gate, a control gate, and a dielectric layer. The floating gate is configured on the substrate, the control gate is configured on the floating gate, and the dielectric layer is interposed between the floating gate and the control gate. The first spacer is around the stack structure, and the first spacer includes a first silicon nitride layer that directly contacts with the stack structure.

The fabricating method and the semiconductor chip according to the present disclosure improve the performance of the peripheral logic region while avoiding the current leakage in the memory unit region. The aforementioned shortage is overcome.

BRIEF DESCRIPTION OF THE DRAWINGS

The present invention will become more readily apparent to those ordinarily skilled in the art after reviewing the following detailed description and accompanying drawings, in which:

FIGS. 1 to 5 are cross sectional views illustrating steps of a fabricating method of a semiconductor chip in accordance with an embodiment.

FIG. 6 is a top schematic view of a peripheral structure in a semiconductor chip in accordance with the present embodiment.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Typically, embedded non-volatile memory chips such as programmable read-only memory (PROM), erasable programmable read-only memory (EPROM), electrically erasable programmable read-only memory (EEPROM) or flash memory, usually include a peripheral logic region and a memory unit region. To improve the performance of the metal oxide semiconductor unit located in the peripheral logic region while avoiding the significantly deterioration of the data retention of non-volatile memory unit located in the memory unit region, the present disclosure provides a semiconductor chip and a fabricating method thereof.

Figure 1:
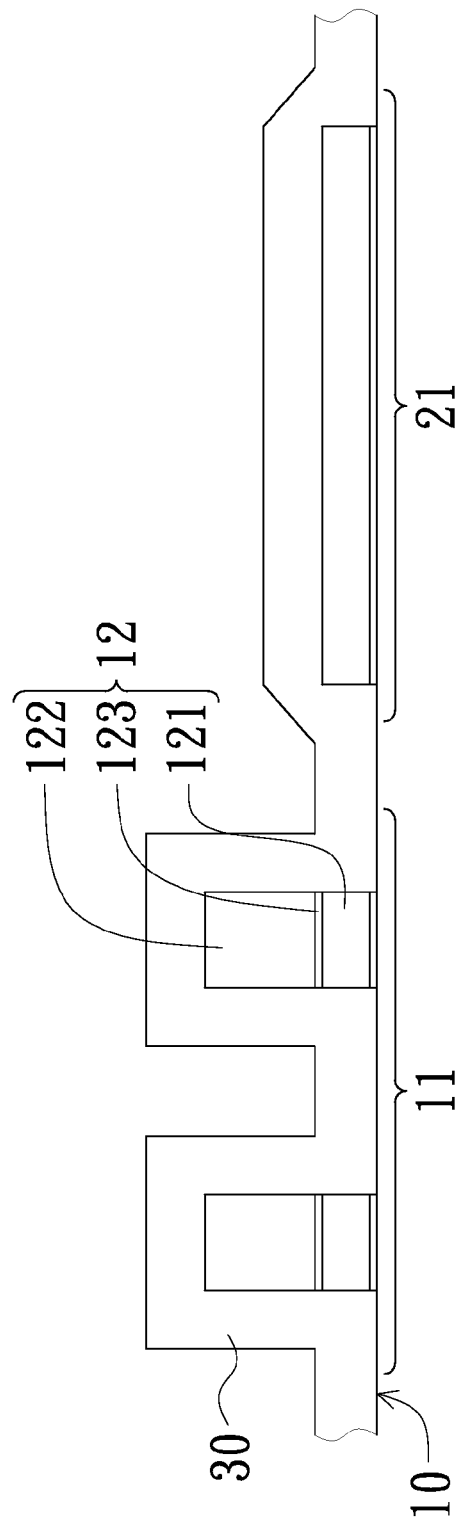

As shown in FIGS. 1 to 5, steps of the fabricating method according to an embodiment are illustrated with cross sectional views. Referring to FIG. 1, a semiconductor silicon substrate 10 defines a memory unit region 11 and a peripheral logic region 21. The memory unit region 11 mainly includes a non-volatile memory unit, and the non-volatile memory unit mainly includes a stack structure 12. Generally, the stack structure 12 includes a floating gate 121, a control gate 122 and a dielectric layer 123. The floating gate 121 is configured on the silicon substrate 10, the dielectric layer 123 is configured on the floating gate 121, and the control gate 122 is configured on the dielectric layer 123. Then, a first silicon oxide layer 30 is formed on the silicon substrate 10. The first silicon oxide layer 30 has a thickness in a range from 500 angstroms to 1000 angstroms, and a coverage region of the first silicon oxide layer 30 includes the memory unit region 11 and the peripheral logic region 21.

Figure 2:
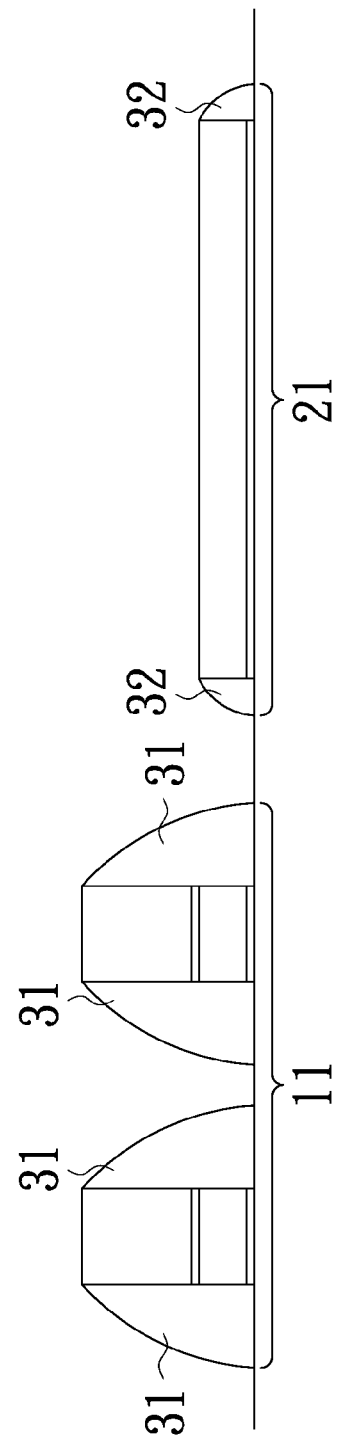

After that, anisotropic etching is used to etch back the first silicon oxide layer 30 thereby forming a first spacer 31 around the stack structure 12, and a cross section of the first spacer 31 is shown in FIG. 2. It is to be noted that the first spacer 31 directly contacts with sidewalls of the stack structure 12, and a thickness of the first spacer 31 is adequate to prevent the memory unit region 11 from being affected by a silicon nitride layer formed in the following processes. As a result, the aforementioned shortage is overcome.

Referring to FIG. 3, after forming the first spacer 31, a photomask (not shown) is defined with a lithography process. The photomask entirely covers the memory unit region but exposes a portion of the peripheral logic region. Then, as shown in FIG. 3, gate structures 22 are formed by an etching process with the photomask.

Next, as shown in FIG. 4, a silicon nitride layer 40 is formed on the gate structures 22 in the peripheral logic region 21. The silicon nitride layer 40 can be formed by a chemical vapor deposition (CVD) process, in which silicon-containing gas reacts with nitride-containing gas and thereby producing silicon nitride. To avoid the damage to the finished semiconductor elements caused by the high temperature, the silicon-containing gas, for example, may be Bis(tertiary-butylamino) silane (BTBAS), which is capable of reacting with nitride-containing gas to form silicon nitride at a relatively low temperature.

In addition to the peripheral logic region 21, the silicon nitride layer 40 also covers the memory unit region 11. However, the silicon nitride layer 40 formed with BTBAS easily conduct electrical charges. Thus, current leakage may occur in the stack structure 12 and lead to loss of stored data when the silicon nitride layer 40 directly contacts with the stack structure 12 of the memory unit region 11. As a result, the data storing performance of the memory unit significantly deteriorates. To solve this problem, as described in above processes, the first spacer 31 is already formed around the stack structure 12 prior to forming the silicon nitride layer 40. The first spacer 31 has a narrow top and a broad bottom. The thickness of the first spacer 31 is adequate such that the first spacer 31 is capable of preventing stack structure 12 from being affected by the silicon nitride layer 40. In a following etching process to the silicon nitride layer 40 for completely removing the silicon nitride layer 40 on the memory unit region 11, the first spacer 31 having adequate thickness and gentle slope surface is capable of efficiently protecting the stack structure 12.

To remove the silicon nitride layer 40 on the memory unit region 11, an etching back process to the silicon nitride layer 40 can be performed without using a photomask. Besides, due to the gentle slope surface of the first spacer 31, the step-high of the silicon nitride layer 40 on the first spacer 31 is unobvious. Thus, as shown in FIG. 5, except the silicon nitride layer 40 around the gate structures 22, other portions of the silicon nitride layer 40 are completely removed. The remaining portions of the silicon nitride layer 40 around the gate structures 22 form the second spacer. The second spacer can be used as a doping mask for the light-doped drain (LDD) formed in the following process. As described above, the fabricating method according to the present disclosure improves the performance of the peripheral logic region 21 while avoiding the current leakage in the memory unit region 11. The aforementioned shortage is overcome.

To remove the silicon nitride layer 40 on the memory unit region 11 and remain a portion of the silicon nitride layer 40 that is on the gate structure in the peripheral logic region 21, a lithograph process with a photomask can be used to define a mask that covers the peripheral logic region 21, and then a portion of the silicon nitride layer 40 exposed in the memory unit region 11 is etched. After that, another lithograph process with a photomask can be used to define a mask that covers the memory unit region, and then a portion of the silicon nitride layer 40 exposed in the peripheral logic region 21 is etched. Finally, a structure as shown in FIG. 5 is finished. However, it is to be noted that the above described direct etching-back process to the silicon nitride layer 40 can also achieve the fabrication of the structure. Moreover, the direct etching-back process has the advantages that there is no need to use the photomask and the complicated fabrication process. In addition, compared with the lithography process with photomask, the direct etching-back process can also reduce the cost.

In addition, the objective of etching the first silicon oxide layer 30 is, as shown in FIG. 2, to form the first spacer 31 around the stack structure 12. However, this etching process also etches the first silicon oxide layer 30 in the peripheral logic region 21 to produce a third spacer 32 around the peripheral logic region. The third spacer 32 also has a narrow top and a broad end. Although the third spacer 32 is the additionally produced structure; however, to avoided additional removing steps, the third spacer 32 may also be remained. It is understood that during the formation of the gate structures 22 in the peripheral logic region 21, if a polysilicon peripheral structure 23 at the third spacer 32 is etched away simultaneously, the third spacer 32 may easily fall down thereby damaging the stability of the semiconductor structure, and even cause pollution. Therefore, the peripheral structure 23 may also be remained after forming the gate structure 22, and a thickness of the peripheral structure 23 should be enough for supporting the third spacer 32 (as shown in FIG. 3). Generally, a thickness in a range from 0.2 micrometers to 0.3 micrometers is enough for this purpose. In this manner, the peripheral structure 23 is formed without any additional steps.

Additionally, in the present embodiment, a second silicon oxide layer 35 can be formed prior to forming the silicon nitride layer 40, and a third silicon oxide layer 36 can be formed after forming the silicon oxide layer 40. In this manner, a silicon compound layer 50 of a three-layered structure is formed. As shown in FIG. 5, when the silicon compound layer 50 in the memory unit region 11 is removed, portions of the silicon compound layer 50 around the gate structures 22 in the peripheral logic region 21 are remained to form the second spacer 51. The second spacer 51 improves the performance of metal oxide semiconductor elements in the peripheral logic region 21.

FIG. 6 is a top schematic view of the peripheral structure in accordance with the present embodiment. Referring to FIGS. 5 and 6 together, similar to the second spacer 51 formed around the gate structures 22 by remaining portions of the silicon compound layer 50, there is also a second spacer 51 formed at a first side surface 23a of the peripheral structure 23 (see FIG. 6). The third spacer 32 is disposed around a second side surface 23b of the peripheral structure 23.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor chip, comprising:
a substrate;
a memory unit region, configured on the substrate, and the memory unit region comprising:
a stack structure, comprising:
a floating gate, configured on the substrate;
a control gate, configured on the floating gate; and
a dielectric layer interposed between the floating gate and the control gate;
a first spacer, configured around the stack structure, and the first spacer comprising a first silicon oxide layer that directly contacts with the stack structure;
a peripheral logic region, configured on the substrate, and the peripheral logic region comprising:
a gate structure, configured on the substrate; and
a second spacer, configured on a side surface of the gate structure, wherein the second spacer is a silicon compound layer of a three-layered structure and the silicon compound layer comprises:
a silicon nitride layer;
a second silicon oxide layer, configured below the silicon nitride layer; and
a third silicon oxide layer, configured above the silicon nitride layer;
a peripheral structure, configured on the substrate, and another second spacer being disposed at a first side surface of the peripheral structure; and
a third spacer, configured on a second side surface of the peripheral structure, wherein the third spacer comprises the first silicon oxide layer.

2. The semiconductor chip of claim 1, wherein both of the first spacer and the second spacer comprise a top and a bottom, wherein the bottom has a width greater than that of the top.

3. The semiconductor chip of claim 1, wherein the peripheral structure has a thickness in a range from 0.2 micrometers to 0.3 micrometers.

* * * * *